US010600937B1

United States Patent
Roitman et al.

(10) Patent No.: US 10,600,937 B1
(45) Date of Patent: Mar. 24, 2020

(54) PRECISE BONDLINE CONTROL BETWEEN LED COMPONENTS

(71) Applicant: Lumileds Holding B.V., Schiphol (NL)

(72) Inventors: Daniel Bernardo Roitman, San Jose, CA (US); Sujan-Ehsan Wadud, Kuala Lumpur (MY); Michael Laughner, San Jose, CA (US); William Collins, San Jose, CA (US); Darren Dunphy, San Jose, CA (US); Prashant Kumar Singh, San Jose, CA (US)

(73) Assignee: LUMILEDS HOLDING B.V. (NL)

(*) Notice: Subject to any disclaimer, the term of this patent is extended or adjusted under 35 U.S.C. 154(b) by 0 days.

(21) Appl. No.: 16/133,311

(22) Filed: Sep. 17, 2018

(51) Int. Cl.
*H01L 33/44* (2010.01)
*H01L 51/50* (2006.01)
*H01L 33/50* (2010.01)
*C09J 183/04* (2006.01)
*C23C 16/455* (2006.01)
*C09J 5/06* (2006.01)
*C23C 16/40* (2006.01)
*C09J 11/04* (2006.01)

(52) U.S. Cl.
CPC ........... *H01L 33/44* (2013.01); *C09J 5/06* (2013.01); *C09J 11/04* (2013.01); *C09J 183/04* (2013.01); *C23C 16/40* (2013.01); *C23C 16/45525* (2013.01); *H01L 33/505* (2013.01); *H01L 51/5044* (2013.01)

(58) Field of Classification Search
CPC .... H01L 33/505; H01L 51/5044; C09J 11/04; C09J 5/06; C09J 183/04
See application file for complete search history.

(56) References Cited

U.S. PATENT DOCUMENTS

| 5,232,962 A | * | 8/1993 | Dershem | ............ C09J 5/00 |
| | | | | 257/E21.503 |
| 5,840,407 A | * | 11/1998 | Futhey | ............ B44F 1/063 |
| | | | | 428/167 |
| 6,784,555 B2 | | 8/2004 | Watson | |

(Continued)

FOREIGN PATENT DOCUMENTS

| EP | 2555262 A2 | 2/2013 |
| EP | 2620989 A2 | 7/2013 |

(Continued)

OTHER PUBLICATIONS

Li et al., "Application of Spacer Filled Silicone Die Adhesive in Stacked Chip Technology." (2003).

(Continued)

*Primary Examiner* — William F Kraig
*Assistant Examiner* — Khatib A Rahman

(57) ABSTRACT

Devices and techniques are disclosed herein which include a first LED device layer, a second LED device layer, and an adhesive bondline disposed between the first LED device layer and the second LED device layer. The adhesive bondline includes a bondline thickness, a plurality of spacers disposed within the adhesive bondline, and a silicone matrix. The plurality of spacers may have a diameter or a shortest axis between 0.5 and 10 micrometers and the coefficient of variation is 10% or less. The plurality of spacers may be include $SiO_2$, alumina, soda lime glass, may be inorganic, or polymeric.

15 Claims, 9 Drawing Sheets

(56) References Cited

U.S. PATENT DOCUMENTS

| | | | |
|---|---|---|---|
| 6,949,880 B1* | 9/2005 | Guenther | B81B 7/0058 |
| | | | 313/504 |
| 2008/0116467 A1 | 5/2008 | Mueller et al. | |
| 2014/0091347 A1* | 4/2014 | Shirakawa | C09J 7/22 |
| | | | 257/98 |
| 2018/0122993 A1 | 5/2018 | Camras et al. | |
| 2018/0182934 A1 | 6/2018 | Lin-Lefebvre et al. | |

FOREIGN PATENT DOCUMENTS

| | | |
|---|---|---|
| JP | 2018-049875 A | 3/2018 |
| WO | 2010/017831 A1 | 2/2010 |

OTHER PUBLICATIONS

European Search Report corresponding to application No. EP18204947, dated Apr. 11, 2019, 1 page.

* cited by examiner

PRECISE BONDLINE CONTROL BETWEEN LED COMPONENTS

BACKGROUND

Light emitting diodes (LEDs), which include light emitting elements (LEEs), are commonly used as light sources in various applications. LEDs can be more energy-efficient than traditional light sources, providing much higher energy conversion efficiency than incandescent lamps and fluorescent light, for example.

To manufacture an LED, adhesive layers are often used between different components of the LED. To optimize the operation of an LED, one or more of the adhesive layers should conform by having certain properties. These properties can include, but are not limited to, temperature requirements, coloring requirements, adhesion, and the like.

SUMMARY

According to aspects of the disclosure, devices are disclosed herein which include a first LED device layer, a second LED device layer, and an adhesive bondline disposed between the first LED device layer and the second LED device layer. The adhesive bondline includes a bondline thickness, a plurality of spacers disposed within the adhesive bondline, and a silicone matrix. The plurality of spacers may have a diameter or a shortest axis as low as 0.5 micrometers to as high 10 micrometers, and preferably as high as 5 micrometers, with each spacer sample having a coefficient of variation (CV) preferably no larger than 10% and preferably no larger than 5%. The plurality of spacers may include silica, alumina, crosslinked polystyrene-co-divinylbenze (PS-co-DVB) and may be inorganic or organic.

According to aspects of the disclosure, a method is disclosed herein which includes depositing or obtaining a first LED device layer, depositing an adhesive bondline between the first LED device layer and a second LED device layer. The adhesive bondline may have a bondline thickness and may include a plurality of spacers disposed within the adhesive bondline, and a silicone matrix. The plurality of spacers may have a diameter or a shortest axis between 0.5 and 10 micrometers, and preferably between 1 and 5 micrometers, and the coefficient of variability (CV) not larger than 10%, and preferably not larger than 5%, for each sample of spacers the mean diameter or shortest axis. The plurality of spacers may be include silica, alumina, soda lime glass, PS-co-DVB, and may be inorganic or polymeric.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1A:
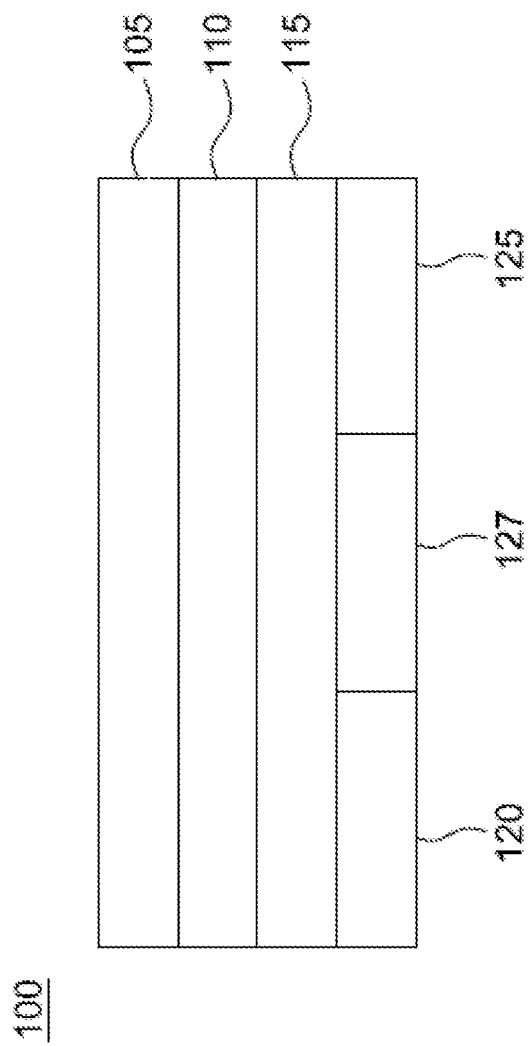
FIG. 1A is a diagram of an example light emitting element (LEE) that includes a light emitting semiconductor structure and a composite structure.

According to aspects of the disclosure, an adhesive layer may be used to join two or more layers in a light emitting device. The layers may be any applicable layers of a light emitting device such as a substrate, a die, a wavelength converting layer, a phosphor layer, an off-state white layer, or the like. The adhesive layer may be deposited onto a first layer and all or a portion of the deposited adhesive layer may remain between the two layers after the second layer has been attached to the first component via the adhesive layer.

Certain properties of the adhesive layer may enable a light emitting device to operate in an optimal manner. The properties may include an amount of tilt experienced by either of the two layers when the layers are bound via the adhesive, an amount of gas permeability (such as, but not limited to, oxygen or nitrogen gas permeability) within the adhesive layer, a temperature threshold, and a bondline gap thickness. These properties may contribute to the overall efficiency and reliability of the light emitting device.

According to aspects of the disclosure, an adhesive bondline may include a plurality of spacers disposed within the adhesive bondline and a matrix, such as a silicone matrix, which may promote the gathering of the components of the adhesive bondline. The thickness of the adhesive bondline may be, at least in part, a factor of the size of the spacers which may be determined based on multiple factors including, but not limited to, a temperature threshold, environmental gases, such as oxygen, permeability threshold, an available or expected current, or the like. The spacers may effectively control the bondline thickness to reduce an amount of tilt and to obtain a desired bondline thickness. This reduction in tilt and/or the bondline thickness may enable a desired amount of environmental gas permeation (e.g., oxygen permeation) and allow for a desired temperature parameter to be met.

According to an implementation, it may be preferable to provide the least number of spacers that enable a desired bondline thickness and reduction or prevention of browning within the bondline, without reducing or without significantly reducing the light output performance via the bondline. According to an implementation, browning may be caused by the generation of light absorbing moieties that result in drop or loss of lumen output. Browning may occur as a result of deprivation of environmental gasses and their applicable permeation through the bondline and/or the presence of organic contaminants. Additionally, the plurality of spacers may enable more desirable control of device geometry such as, for example, tilt reduction, as further disclosed herein. The spacers may include silica, alumina, inorganic glass, or polymer.

The number of spacers may be determined based on one or more factors. According to implementations, fewer spacers may result in optimal performance since spacers with a different refractive index than the adhesive may interfere with light output characteristics, fewer spacers may result in a desirable viscosity of the dispensing resin, and fewer spacers may also reduce the number of voids or fingering between layers of a device. However, as disclosed herein, a device may require a minimum number of spacers such that the spacers provide distributed support to separate the device layers. The support may be distributed to prevent tilting caused by uneven or undistributed grouping of spacers. Further, one or more forces may be applied to the spacers, which, without a minimum applicable number of spacers, may cause deformation beyond an acceptable deformation threshold.

The mean size of the spacers may be large enough to obtain a bondline thickness that enables enough environmental gas permeation to remove or reduce browning, yet small enough to obtain a bondline thickness that is not so large as to result in an undesirable thermal barrier which may cause a device to overheat or operate at a higher than desirable temperature. The coefficient of variation (CV) between spacers may be low enough such that tilt caused by the bondline is minimal, as further disclosed herein.

The spacer size may further depend on characteristics of the adhesive material such that, for example, an adhesive with a refractive index (RI) equal to 1.41 may be about 30 times more oxygen permeable than an adhesive with a RI of 1.57 (assuming, for example, that the refractive index is controlled by the ratio of methyl and phenyl side groups in the polysiloxanes structure). An adhesive that is highly permeable may allow small spacers, ca 0.5 um to 1 um, whereas a highly impermeable adhesive (e.g., with an RI of 1.57) will require larger spacers, e.g., greater than 1 um, to achieve similar environmental gas permeability. However, the amount of light extracted via a device may increase as the RI of an adhesive increases.

Accordingly, the spacer size and corresponding bondline thickness may be determined based on a number of factors including the prevention of browning, the device geometry, the environmental gas permeability, thermal management, the RI, the desired light extraction efficiency, and the like.

Examples of different light fixture will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIG. 1A is a diagram of an example light emitting element (LEE) 100 that includes a light emitting semiconductor structure 115, a wavelength converting material 110, and an optional coating 105 on the wavelength converting material 110. Contacts 120 and 125 may be coupled to the light emitting semiconductor structure 115, either directly or via another structure such as a submount, for electrical connection to a circuit board or other substrate or device. In embodiments, the contacts 120 and 125 may be electrically insulated from one another by a gap 127, which may be filled with a dielectric material. The light emitting semiconductor structure 115 may be any light emitting semiconductor structure that emits light that may be converted to light having a different color point or spectral characteristics via a wavelength converting material. For example, the light emitting semiconductor structure 115 may be formed from III-V semiconductors, II-VI semiconductors, group IV semiconductors, and/or mixtures or alloys thereof. These example semiconductors have indices of refraction ranging from about 2.4 to about 4.1 at the typical emission wavelengths of LEDs in which they are present. For example, III-Nitride semiconductors, such as GaN, have refractive indices of about 2.4 at 500 nm, and III-Phosphide semiconductors, such as InGaP, have refractive indices of about 3.7 at 600 nm. Contacts 120 and 125 may be formed from a solder, such as AuSn, AuGa, AuSi or SAC solders.

Figure 1B:
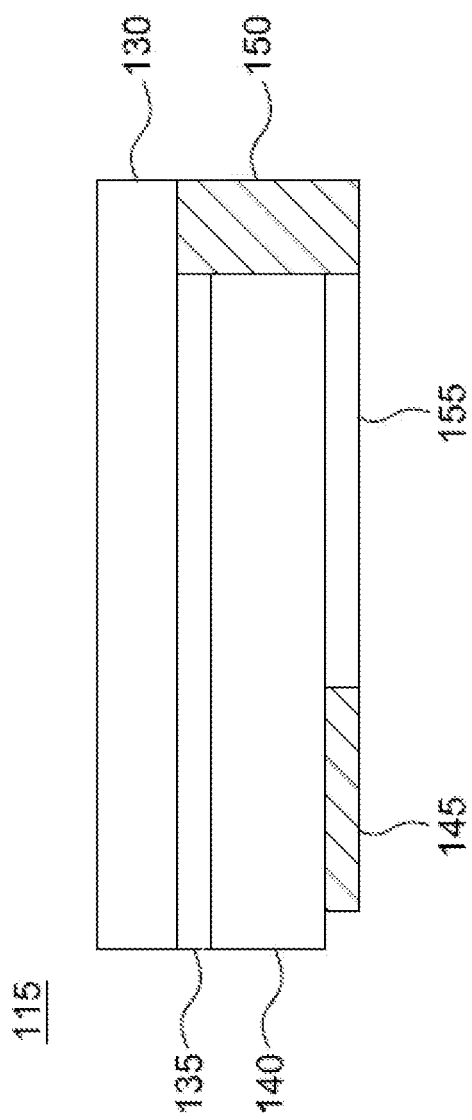
FIG. 1B is a diagram of an example light emitting semiconductor structure that may be included in the LEE of FIG. 1A.

FIG. 1B is a diagram of an example light emitting semiconductor structure 115 that may be included in the LEE 100 of FIG. 1A. The illustrated example is a flip chip structure. However, one of ordinary skill in the art will understand that the embodiments described herein may be applied to other types of LED designs, such as vertical, lateral, and multi junction devices.

In the example illustrated in FIG. 1B, the light emitting semiconductor structure 115 includes a light emitting active region 135 disposed between a semiconductor layer or semiconductor region of n-type conductivity (also referred to as an n-type region) 130 and a semiconductor layer or region of p-type conductivity (also referred to as a p-type region) 140. Contacts 145 and 150 are disposed in contact with a surface of the light emitting semiconductor structure 115 and electrically insulated from one another by a gap 155, which may be filled by a dielectric material, such as an oxide or nitride of silicon (i.e., $SiO_2$ or $Si_3N_4$). In the illustrated embodiment, contact 145 (also referred to as a p-contact) is in direct contact with a surface of the p-type region 140, and the contact 150 (also referred to as an n-contact) is in direct contact with a surface of the n-type region 130. Although not shown in FIG. 1B, a dielectric material, such as disposed in the gap 155, may also line side walls of the light emitting active region 135 and p-type region 140 to electrically insulate those regions from the contact 150 to prevent shorting of the p-n junction.

The n-type region 130 may be grown on a growth substrate and may include one or more layers of semiconductor material. Such layer or layers may include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Like the n-type region 130, the p-type region 140 may include multiple layers of different composition, thickness, and dopant concentrations, including layers that are not intentionally doped, or n-type layers. While layer 130 is described herein as the n-type region and layer 140 is described herein as the p-type region, the n-type and p-type regions could also be switched without departing from the scope of the embodiments described herein.

The light emitting active region 135 may be, for example, a p-n diode junction associated with the interface of p-region 140 and n-region 135. Alternatively, the light emitting active region 135 may include one or more semiconductor layers that are doped n-type or p-type or are un-doped. For example, the light emitting active region 135 may include a single thick or thin light emitting layer. This includes a homojunction, single heterostructure, double heterostructure, or single quantum well structure. Alternatively, the light emitting active region 135 may be a multiple quantum well light emitting region, which may include multiple quantum well light emitting layers separated by barrier layers.

The p-contact 145 may be formed on a surface of the p-type region 140. The p-contact 145 may include multiple conductive layers, such as a reflective metal and a guard metal, which may prevent or reduce electromigration of the reflective metal. The reflective metal may be silver or any other suitable material, and the guard metal may be TiW or TiWN. The n-contact 150 may be formed in contact with a surface of the n-type region 130 in an area where portions of the active region 135, the n-type region 140, and the p-contact 145 have been removed to expose at least a portion of the surface of the n-type region 130. The sidewall of the exposed mesa or via may be coated with a dielectric to prevent shorting. The contacts 145 and 150 may be, for example, metal contacts formed from metals including, but not limited to, gold, silver, nickel, aluminum, titanium, chromium, platinum, palladium, rhodium, rhenium, ruthenium, tungsten, and mixtures or alloys thereof. In other examples, one or both contacts 145 and 150 may be formed from transparent conductors, such as indium tin oxide.

The n-contact 150 and p-contact 145 are not limited to the arrangement illustrated in FIG. 1B and may be arranged in any number of different ways. In embodiments, one or more n-contact vias may be formed in the light emitting semiconductor structure 115 to make electrical contact between the n-contact 150 and the n-type layer 130. Alternatively, the n-contact 150 and p-contact 145 may be redistributed to form bond pads with a dielectric/metal stack as known in the art. The p-contact 145 and the n-contact 150 may be electrically connected to the contacts 120 and 125 of FIG. 1A, respectively, either directly or via another structure, such as a submount.

The wavelength converting material 110 may be any luminescent material, such as a phosphor, phosphor particles in a transparent or translucent binder or matrix, or a ceramic phosphor element, which absorbs light of one wavelength and emits light of a different wavelength. If the wavelength converting material 110 is a ceramic phosphor element, the ceramic phosphor element may be, for example, a ceramic phosphor plate, such as a platelet of phosphor, for generating one color of light, or a stack of ceramic phosphor platelets for generating different spectral characteristics or colors of light. The ceramic phosphor plate may have an RI of 1.4 or greater (e.g., 1.7 or greater) at the wavelengths emitted by the light emitting semiconductor structure 115.

The wavelength converting material 110 may be applied in a layer having a thickness that may depend on the wavelength converting material used or other factors related to enhancing the color point shift as a function of drive current as described in more detail below. For example, a layer of wavelength converting material 110 may be approximately 50 µm in thickness while other wavelength converting materials may be formed in layers as thin as 20 µm or as thick as 200 µm. In embodiments, the wavelength converting material 110, such as a ceramic phosphor element, may be pre-formed into a wavelength converting element and attached to the light emitting semiconductor structure 115 using an adhesive or any other method or material known in the art.

In embodiments, the light emitting semiconductor structure 115 may emit blue light. In such embodiments, the wavelength converting material 110 may include, for example, a yellow emitting wavelength converting material or green and red emitting wavelength converting materials which will produce white light when the light emitted by the respective phosphors combines with the blue light emitted by the light emitting semiconductor structure 115. In other embodiments, the light emitting semiconductor structure 115 emits UV light. In such embodiments, the wavelength converting material 110 may include, for example, blue and yellow wavelength converting materials or blue, green and red wavelength converting materials. Wavelength converting materials emitting other colors or infrared light may be added to tailor the spectrum of light emitted from the device 100.

In embodiments, the wavelength converting material 110 may be composed of $Y_3Al_5O_{12}:Ce^{3+}$. The wavelength converting material 110 may be an amber to red emitting rare earth metal-activated oxonitridoalumosilicate of the general formula $(Ca_{1-x-y-z}Sr_xBa_yMg_z)_{1-n}(Al_{1-a+b}Ba)Si_{1-b}N_{3-b}O_b:RE_n$ wherein $0 \leq x \leq 1$, $0 \leq y \leq 1$, $0 \leq z \leq 1$, $0 \leq a \leq 1$, $0 \leq b \leq 1$ and $0.002 \leq n \leq 0.2$, and RE may be selected from europium(II) and cerium(III). The phosphor in the ceramic phosphor plate may also be an oxido-nitrido-silicate of general formula $EA_{2-z}Si_5-aBaN_8-aO_a:Ln_z$, wherein $0 \leq z \leq 1$ and $0 < a < 5$, including at least one element EA selected from the group consisting of Mg, Ca, Sr, Ba and Zn and at least one element B selected from the group consisting of Al, Ga and In, and being activated by a lanthanide (Ln) selected from the group consisting of cerium, europium, terbium, praseodymium and mixtures thereof.

In other embodiments, the wavelength converting material 110 may include aluminum garnet phosphors with the general formula $(Lu_{1-x-y-a-b}Y_xGd_y)_3(Al_{1-z}Ga_z)_5O_{12}:Ce_aPr_b$, wherein $0 < x < 1$, $0 < y < 1$, $0 \leq z \leq 0.1$, $0 < a \leq 0.2$ and $0 \leq b \leq 0.1$, such as $Lu_3Al_5O_{12}:Ce^{3+}$ and $Y_3Al_5O_{12}:Ce^{3+}$, which emits light in the yellow-green range; and $(Sr_{1-x-y}Ba_xCa_y)_{2-z}Si_5-aAlaN_8-aO_a:Eu_z$ 2+, wherein $0 \leq a < 5$, $0 \leq x \leq 1$, $0 \leq y \leq 1$, and $0 \leq z \leq 1$ such as $Sr_2Si_5N_8:Eu^{2+}$, which emits light in the red range. Other green, yellow and red emitting phosphors may also be suitable, including $(Sr_{1-a-b}Ca_bBa_c)Si_xN_yO_z:Eu$ 2+; (a=0.002-0.2, b=0.0-0.25, c=0.0-0.25, x=1.5-2.5, y=1.5-2.5, z=1.5-2.5) including, $SrSi_2N_2O_2:Eu^{2+}$; $(Sr_{1-u-v-x}Mn_uCa_vBa_x)(Ga_{2-y-z}Al_y$-

InzS4):Eu2+ including, for example, SrGa2S4:Eu2±; Sr1-xBaxSiO4:Eu2+; and (Ca1-xSrx)S:Eu2+ wherein 0<x<1 including, CaS:Eu2+ and SrS:Eu2+. Other suitable phosphors include, CaAlSiN3:Eu2+, (Sr,Ca)AlSiN3:Eu2+, and (Sr, Ca, Mg, Ba, Zn)(Al, B, In, Ga)(Si, Ge)N3:Eu2+.

In other embodiments, the wavelength conversion material 110 may also have a general formula (Sr1-a-bCabBac-MgdZne)SixNyOz:Eua 2+, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 \leq z \leq 2.5$. The wavelength conversion material may also have a general formula of MmAaBbOoNn:Zz where an element M is one or more bivalent elements, an element A is one or more trivalent elements, an element B is one or more tetravalent elements, O is oxygen that is optional and may not be in the phosphor plate, N is nitrogen, an element Z that is an activator, $n=2/3$ $m+a+4/3b-2/3o$, wherein m, a, b can all be 1 and o can be 0 and n can be 3. M is one or more elements selected from Mg (magnesium), Ca (calcium), Sr (strontium), Ba (barium) and Zn (zinc), the element A is one or more elements selected from B (boron), Al (aluminum), In (indium) and Ga (gallium), the element B is Si (silicon) and/or Ge (germanium), and the element Z is one or more elements selected from rare earth or transition metals. The element Z is at[l]east one or more elements selected from Eu (europium), Mg (manganese), Sm (samarium) and Ce (cerium). The element A can be Al (aluminum), the element B can be Si (silicon), and the element Z can be Eu (europium).

The wavelength conversion material 110 may also be an Eu2+ activated Sr—SiON having the formula (Sr1-a-bCab-Bac)SixNyOx:Eua, wherein $a=0.002-0.2$, $b=0.0-0.25$, $c=0.0-0.25$, $x=1.5-2.5$, $y=1.5-2.5$.

The wavelength conversion material 110 may also be a chemically-altered Ce: YAG (Yttrium Aluminum Garnet) phosphor that is produced by doping the Ce: YAG phosphor with the trivalent ion of praseodymium (Pr). The wavelength conversion material 110 may include a main fluorescent material and a supplemental fluorescent material. The main fluorescent material may be a Ce: YAG phosphor and the supplementary fluorescent material may be europium (Eu) activated strontium sulfide (SrS) phosphor ("Eu:SrS"). The main fluorescence material may also be a Ce: YAG phosphor or any other suitable yellow-emitting phosphor, and the supplementary fluorescent material may also be a mixed ternary crystalline material of calcium sulfide (CaS) and strontium sulfide (SrS) activated with europium ((CaxSr1 x)S:Eu2+). The main fluorescent material may also be a Ce:YAG phosphor or any other suitable yellow-emitting phosphor, and the supplementary fluorescent material may also be a nitrido-silicate doped with europium. The nitrido-silicate supplementary fluorescent material may have the chemical formula (Sr1-x-y-zBaxCay)2Si5N8:Euz 2+ where $0 \leq x$, $y \leq 0.5$ and $0 \leq z \leq 0.1$.

In embodiments, the wavelength conversion material 110 may include strontium-lithium-aluminum: europium (II) ion (SrLiAl3N4:Eu2+) class (also referred to as SLA), including MLiAl3N4:Eu2+(M=Sr, Ba, Ca, Mg). In a specific embodiment, the luminescent particles may be selected from the following group of luminescent material systems: MLiAl3N4:Eu (M=Sr, Ba, Ca, Mg), M2SiO4:Eu (M=Ba, Sr, Ca), MSe1-xSx:Eu (M=Sr, Ca, Mg), MSr2S4:Eu (M=Sr, Ca), M2SiF6:Mn (M=Na, K Rb), M2TiF6:Mn (M=Na, K, Rb), MSiAlN3:Eu (M=Ca, Sr), M8Mg(SiO4)4Cl2:Eu (M=Ca, Sr), M3MgSi2O8:Eu (M=Sr, Ba, Ca), MSi2O2N2: Eu (M=Ba, Sr, Ca), M2Si5-xAlxOxN8-x:Eu (M=Sr, Ca, Ba). However, other systems may also be of interest and may be protected by a coating. Also combinations of particles of two or more different luminescent materials may be applied, such as e.g. a green or a yellow luminescent material in combination with a red luminescent material.

In embodiments, the wavelength conversion material 110 may be a blend of any of the above-described phosphors.

Figure 2A:
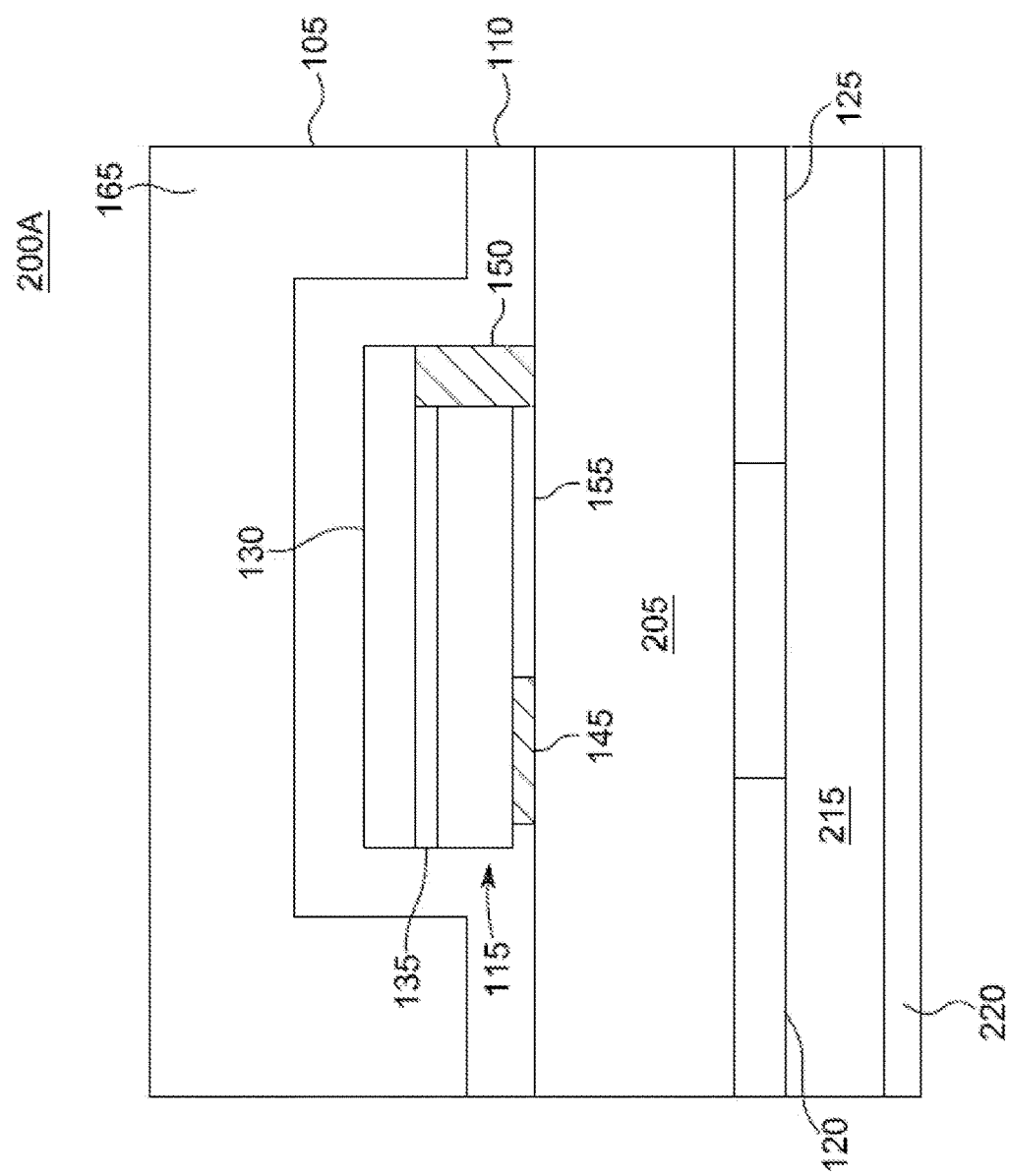
FIG. 2A is a diagram of an example light emitting device (LED) that may include the LEE of FIG. 1A.

FIG. 2A is a diagram of an example light emitting device (LED) 200A. In the example illustrated in FIG. 2A, the LED 200A includes the light emitting semiconductor structure 115 of FIG. 1B, which is mounted to a submount 205 that includes the contacts 120 and 125. The light emitting semiconductor structure 115 may be mounted to the submount 205 by an electrical coupling between the contacts 145 and 150 on the light emitting semiconductor structure 115 and submount electrodes on an adjacent surface of the submount 205 (not shown in FIG. 2A). The submount electrodes may be electrically connected by vias (not shown) to the contacts 120 and 125 on the opposite surface of the submount 205. In embodiments, the LED 200A may be mounted to a printed circuit board (PCB) 215. In such embodiments, the submount 205 may be mounted via the contacts 120 and 125 to the PCB 215. Metal traces on the circuit board may electrically couple the contacts 120 and 125 to a power supply, such that an operational or drive voltage and current may be applied to the LED when it is desired to turn the LED on.

The submount 205 may be formed from any suitable material, such as ceramic, Si, or aluminum. If the submount material is conductive, an insulating material may be disposed over the substrate material, and the metal electrode pattern may be formed over the insulating material. The submount 205 may act as a mechanical support, provide an electrical interface between the n and p electrodes on the LED chip and a power supply, and provide heat sinking. In embodiments, a heat sink may alternatively or additionally be provided on the PCB 215, such as a metal core PCB-MCPCB heat sink 220 illustrated in FIG. 2A. While the heat sink 220 is illustrated in FIG. 2A as being attached to the bottom of the PCB 215, one of ordinary skill in the art will recognize that other arrangements are possible without departing from the scope of the embodiments described herein.

In the example LED 200A, the wavelength converting material 110 completely surrounds the light emitting semiconductor structure 115 on all surfaces except the surface that electrically connects the light emitting semiconductor structure 115 to the submount 205. The optional coating 105 may be disposed in direct contact with the wavelength converting material 110. The coating may not be a separate layer, may be a coating on the individual phosphor particles or may be formed on the ceramic phosphor. These pores may be filled with a binder or matrix material and may be part of the wavelength converter 110. Coatings of phosphor materials are described in U.S. patent application Ser. No. 15/802,273, which was filed on Nov. 2, 2017 and is incorporated by reference herein in its entirety. Phosphor coatings of sol-gel, atomic layer deposition (ALD), evaporation, sputtering, dip and dry, or spin coating methods include SiO2, Al$_2$O$_3$, HfO2, Ta$_2$O$_5$, ZrO2, TiO2, Y$_2$O$_3$, and Nb2O5.

Figure 2B:
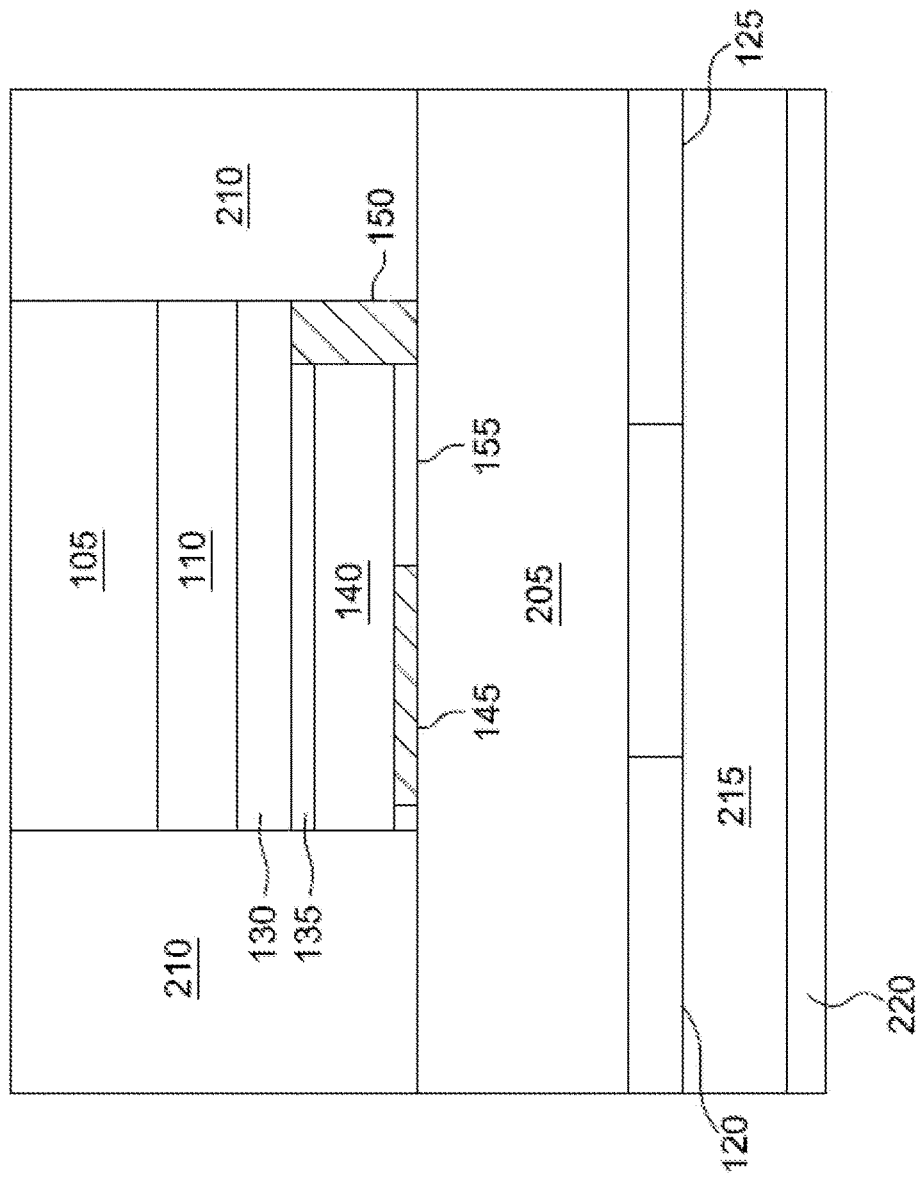
FIG. 2B is a diagram of another example LED that may include the LEE of FIG. 1A.

FIG. 2B is a diagram of another example LED 200B. In the example LED 200B, the wavelength converting material 110 is deposited on the light emitting semiconductor structure 115. The optional coating 105 may be disposed in direct contact with the wavelength converting material 110. A structure 210, such as a frame, is disposed adjacent side surfaces of a stack formed by the light emitting semiconductor structure 115, the wavelength converting material 110 and the optional coating 105 and may surround the stack.

The entire structure 210, but at least inner surfaces of the structure 210 that are adjacent the stack, may be formed from or coated in a light reflecting material, such as an interference layer or a strongly scattering layer, to further minimize absorption of any scattered light.

As disclosed herein, the wavelength converting material 110, such as a ceramic phosphor element, may be preformed into a wavelength converting element and attached to the light emitting semiconductor structure 115 using an adhesive or any other method or material known in the art. A first layer such as a wavelength-converting element may be attached to a second layer, such as the light emitting semiconductor structure or any other substrate via an adhesive that creates a bondline between the two layers. The adhesive bondline may include a plurality of spacers as well as a matrix such as a silicone matrix. The silicone matrix may be configured to gather the layers of the adhesive bondline so they are grouped together. The adhesive bondline may be a composition that includes transparent (e.g., high optical transmissivity, >98%) curable polymer, such as a silicone matrix, and transparent space fillers, such as the spacers disclosed herein.

Loss of LED or like device functionality can be reduced or prevented with the use of the spacers, as disclosed herein. The spacers may enable optimal temperature control, gas permeation (e.g., oxygen permeation), current density, and/or other optimization. Such optimization may reduce or remove transient and/or permanent browning of an adhesive bondline. It may also reduce loss of light output due to photothermal degradation.

According to implementations, the spacer particles may control the bondline thickness of the adhesive bondline. The spacers may control the bondline thickness by physically separating a first layer surface from a second layer surface such that the bondline thickness approximately corresponds to the diameter or height of the spacers. The spacers may be any shape such as, but not limited to, spheres, rods, disks, pyramids, ellipsoids or the like. According to an implementation, the spacers in an adhesive bondline may be configured to orient themselves such that the shortest dimension of the spacer is in a direction perpendicular to the planes of the adherent substrates. For example, a rod may have a long dimension L and a diameter d such that d is less than L. The diameter d may define the thickness of the adhesive bondline as the two layers sperated by the adhesive bondline may be separated by the diameter d. Such orientation may occur spontaneously or through applying a flow or force onto the spacers. Continuing the example, the anisotropic spacer (e.g., the rod) may have a relatively high aspect ratio of the larger dimension to the shorter dimension such that it orients itself with the larger dimension parallel to the surface of the layers and the short dimension perpendicular to the surface of the layers.

Figure 3A:
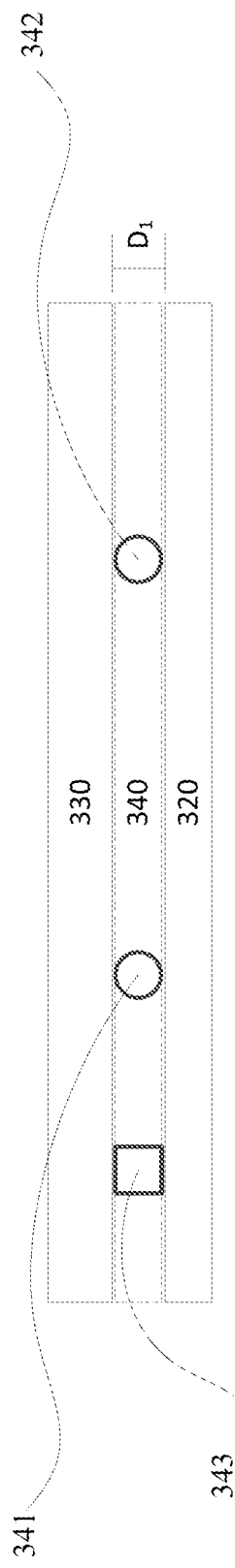
FIG. 3A is a diagram of a spacers within a bondline.

FIG. 3A shows a simplified diagram of a first layer 320 and a second layer 330 separated by an adhesive bondline 340 which comprises three spacers 341, 342, and 343. As shown, the distance $D_1$ corresponds to the diameter or thickness of the spacers 341, 342 and 343. As a result of the spacers 341, 342 and 343 in the adhesive bondline 340, the distance $D_1$ also corresponds to the distance between the first layer 320 and the second layer 330.

Figure 3B:
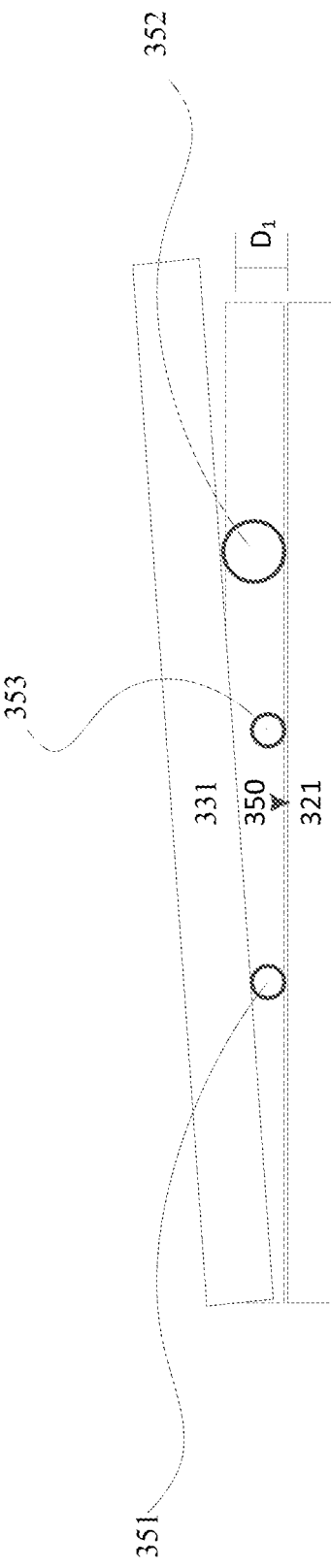
FIG. 3B is another diagram of spacers within a bondline.

In order for the spacers to reliably control the bondline thickness, their size distribution must be narrow. A broad size distribution may result in an uneven base for a layer which is being bonded via the adhesive bondline. As an illustrative example, FIG. 3B shows a first substrate 321, a second substrate 331 and an adhesive bondline 350 between the first substrate 321 and the second substrate 331. As shown, the adhesive bondline 350 may include spacers 351, 352 and 353. The size distribution between the spacers may be large such that the spacer 352 may be larger than the spacers 351 and 353. As a result, as shown, the second substrate 331 may be tilted as it rests on the two spacers 351 and 352. Further, as shown, the spacer 353 may not be supporting the second substrate 331 as the second substrate 331 may not reach the spacer 353. Thus, a broad distribution may result in tilting and may also result in instability due to partial resting on the spacers.

According to an implementation, may be a low one-sided probability of having large outliers in the spacer size distribution. Preferably, the probability of having a particle with diameter in excess of 6-standard deviations may be lower than 0.001 parts per million (ppm). To clarify, the one-sided upper confidence interval corresponds to a 0.001 ppm probability that a randomly chosen spacer has a diameter in excess of six standard deviations greater than a desired mean diameter. Table 1 shows example spacers with their corresponding mean diameters, coefficient of variations (CV), standard deviations and six standard deviation coefficient intervals. The CV is defined as the ratio of the standard deviation to the mean and may be determined based on manufacturing configurations, limitations, and/or capabilities. It also may vary based on the material used to manufacture the spheres.

TABLE 1

|  | Mean Diameter (μm) | CV (%) | Sdev (um) | 6-s Conf Interval (μm) |
| --- | --- | --- | --- | --- |
| Example Spacer type 1 | 4.08 | 2.7 | 0.11 | 4.08 ± 0.66 |
| Example Spacer type 2 | 1.86 | 3.7 | 0.069 | 1.86 ± 0.41 |
| Example Spacer type 3 | 1.18 | 2.5 | 0.0295 | 1.18 ± 0.177 |

As shown in Table 1, the one-sided upper confidence interval corresponding to a 0.001 ppm probability that a randomly chosen spacer has a diameter in excess of six standard deviations corresponds to a deviation of greater than 0.66096 micrometers for the mean diameter of 4.08 micrometers of Example Spacer type 1. Similarly, regarding Example Spacer type 2, six standard deviations for the 1.86 micrometers mean diameter sphere corresponds to 0.41292 micrometers such that a spacer with a mean diameter in excess of 2.27 micrometers would not meet the six standard deviation criteria.

According to an implementation, a preferable spacer size range is between 1 micrometer and 4 micrometer. A spacer average size of 2.5 um and CV of 5% corresponds to a six-sigma confidence interval between 1.75 urn and 3.25 um. A distribution with average size 2.5 um and CV of 10% corresponds to a confidence 2.5±1.5 urn, i.e. from 1 micron to 4 microns.

According to an implementation, nanoparticles, such as quantum dots, may be included in the adhesive bondline and/or within a substrate or wavelength-converting layer. To clarify, such nanoparticles may be part of the adhesive bondline such that they are present in the adhesive bondline in addition to the spacers, as disclosed herein. Nanoparticles, may provide additional functionalities such as refractive index enhancement (e.g. via zirconia nanoparticles), color enhancement, thermomechanical (e.g., modulus, fracture toughness and CTE) enhancements, thermal conductivity enhancements, and/or spectral improvement.

According to an implementation, approximately 100 to 5000 spacers may be provided per device or, alternatively, per mm² in a device within a given adhesive bondline. To clarify, for example, the number of spacers in an average adhesive bondline between an LED substrate and a wavelength-converting layer may be between 100 to 5000 spacers or 100 to 5000 spacers per mm². Assuming an average of 500 spacers per given adhesive bondline, the probability of having a die with a spacer particle larger than the upper confidence limit, as disclosed herein to be 0.0001 ppm, is 500*0.001=0.5 ppm.

As disclosed herein, the number of spacers may be determined based on a number of factors including the amount of force that the spacers in an adhesive bondline can tolerate. The amount of force a spacer can tolerate without deforming beyond an acceptable deformation threshold may be a function of its diameter. Such a tolerance may be expressed using, for example, a Hertzian Contact Analysis. The Hertzian Contact Analysis may be represented by Equation 1 where F represents the loading force in newton (N), $E_i$ represents reduced Young's modulus (Pa), R represents a particle radius in meters (m) and δ represents contact deformation in meters (m).

$$F = \left(\frac{4}{3}\right) E_i * \sqrt{R} \left(\frac{\delta}{2}\right)^{\frac{3}{2}} \quad \text{(Equation 1)}$$

The force F applied to a spherical spacer of elastic modulus $E_{particle}$ and radius R confined between two planar layers of modulus $E_{die}$ results in total deformation δ, based on Equation 1. If the layers are substantially stiffer than the spherical spacer, the deformation may mostly be within the spherical spacer. Here, the strain (relative deformation) on the spherical spacer may be given by ε~(D/δ) where D=2R is the spherical spacer's diameter. It should be noted that Equation one is one model that may be applied and assumes elastic deformation. At a certain threshold of ε (yield point), the spherical spacer may exhibit plastic-elastic deformation as the stress may not be uniform. Certain regions of the sphere may begin to deform plastically while others deform elastically, and at higher strains the deformation may be primarily plastic and non-recoverable.

The yield point may depend on material characteristics, and elastic behavior may generally exists for ε<0.1 (i.e. 10% deformation). Equation 1 may be rearranged to show the dependency of the strain on three physical parameters: Radius, Modulus, and compressive applied force. The strain may grow with the power of 2/3 with the applied force F, it may decrease with same power (2/3) with the modulus E, and it may decrease with the power of 4/3 with the radius of the sphere. Accordingly, in order to maintain a given strain under larger forces F (e.g., by having fewer beads, or applied higher external forces), the radius and/or the modulus must increase. As an example, if $Al_2O_3$ has modulus that is 5× that of silica (bulk values may be 393 GPa and 73 GPa, respectively), then for a given radius, the same strain may be achieved with 5 times the force, or alternatively, with 1/5 of the particles.

As another example, if the acceptable deformation threshold is 12% of the diameter of a spacer, a 4-micrometer silica spherical spacer with an elastic modulus of E=25 GPa may accept ~6 mN (mili-Newtons) of force before passing the deformation threshold of 12%. Alternatively, a 2-micrometer silica spherical spacer may deform by 12% or more when under just 2 mN of force. Therefore, at least 3× the number of size 2-micrometers spherical spacers may be needed when compared to 4-micrometers spherical spacers in order to remain within the 12% deformation threshold under ~6 mN of force.

Accordingly, as an example, if the applied force on a 1 mm×1 mm die is about 1N (100 g of force), at least 500 spacers of size 2.5 micrometers or about 170 spacers of size 4-micrometers spacer, may be needed to safely maintain a bondline thickness without experiencing a crushing event.

Figure 4A:
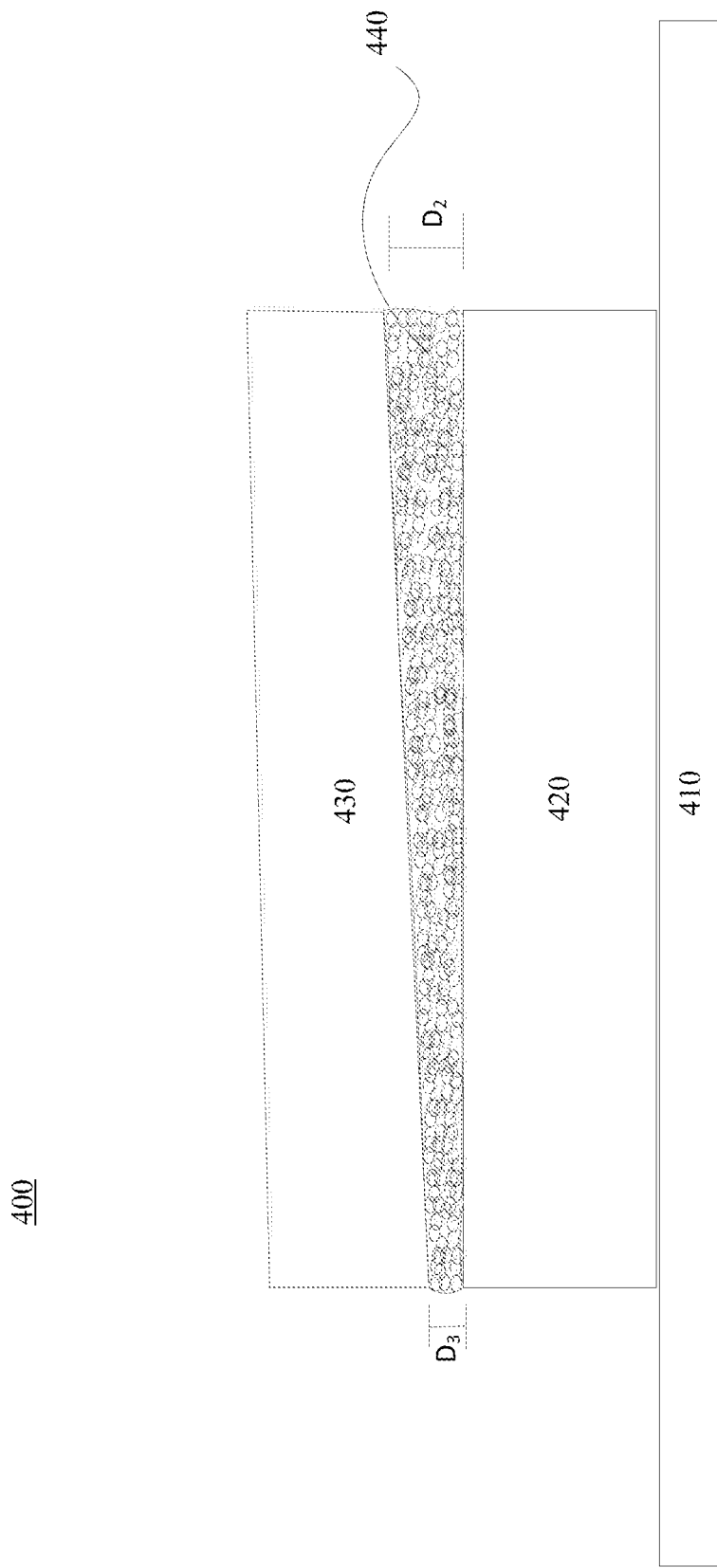
FIG. 4A is a diagram of an example of an LED with bondline without spacers.

FIG. 4A shows a LED device 400 with a substrate 410, a die 420 and a wavelength converting phosphor layer 430. An adhesive bondline 440 joins the die 420 to the wavelength converting phosphor layer 430. It should be noted that the adhesive bondline 440 of FIG. 4A does not include the spacers disclosed herein. As a specific example, the adhesive bondline 440 includes approximately T×p micrograms of material on each device or on each area 1 mm×1 mm in size, where T is the average bondline thickness in micron units and p is the glue density in cc/g (e.g., 1.16 cc/g). For example if the average bondline is 6 micrometers, the mass of glue may be approximately 6.97 micrograms based on T×p where T is 6 micrometers and p is 1.16 cc/g. According to this example, the refractive index of the silicone matrix in the material is 1.41. As shown, the adhesive bondline 440 may be uneven based on how it's dispensed, its viscosity, and/or other properties. The uneven adhesive bondline 440 may cause the wavelength converting phosphor layer 430 to tilt such that one end of the wavelength converting phosphor layer 430 is higher than another end of the wavelength converting phosphor layer 430. In the specific example, the thickness $D_2$ of the adhesive bondline 440 at the right side may be 6.2 micrometers thick whereas the thickness $D_3$ on the left side may be 1.83 micrometers.

Figure 4B:
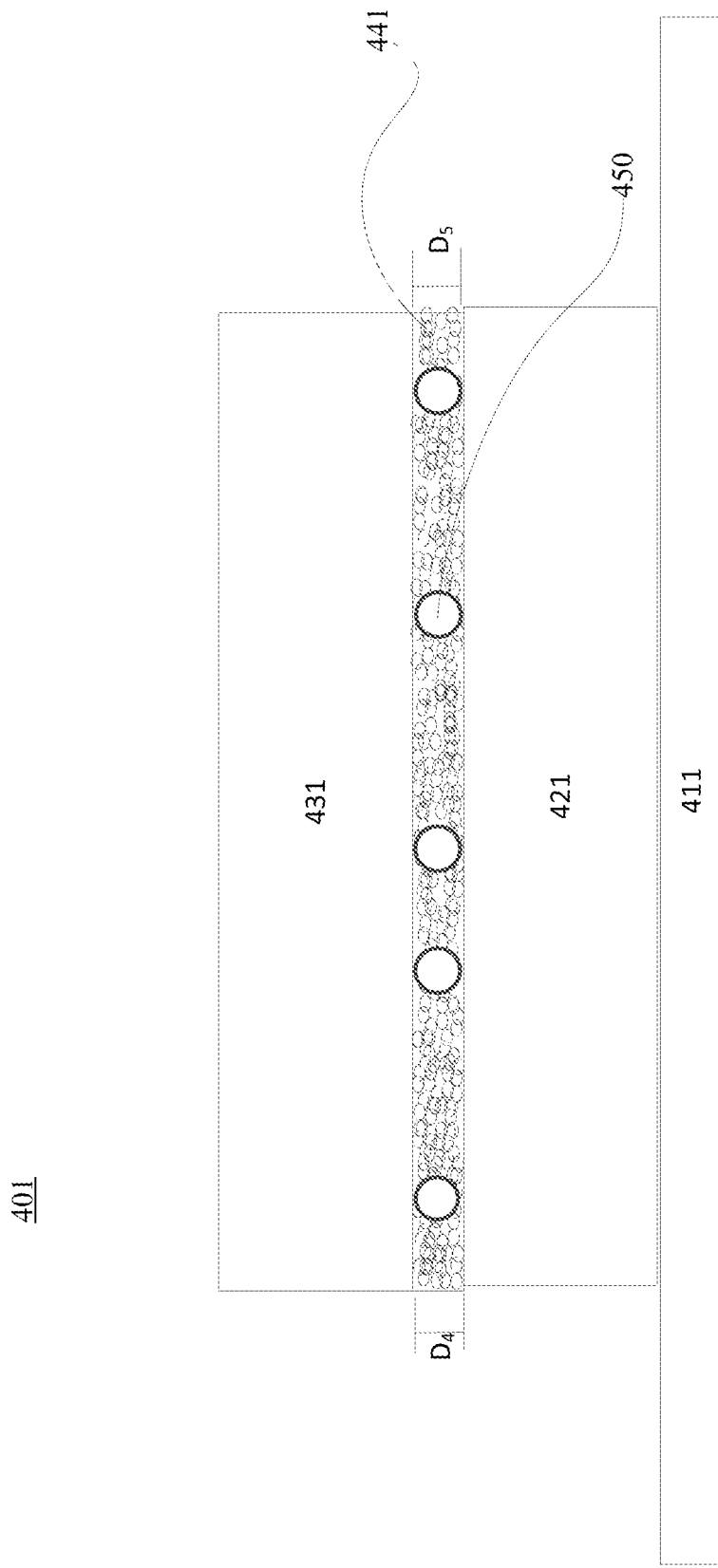
FIG. 4B is a diagram of an example of an LED with a bondline with spacers.

FIG. 4B shows a LED device 401 with a substrate 411, a die 421 and a wavelength converting phosphor layer 431. An adhesive bondline 441 joins the die 421 to the wavelength converting phosphor layer 431. It should be noted that the adhesive bondline 441 of FIG. 4B includes spacers 450, as disclosed herein. As a specific example, the adhesive bondline 441 includes approximately 6 micrograms of material on each substrate 1 mm×1 mm in size. The material includes 0.15% of $SiO_2$ sphere spacers with a mean diameter of 4.08 micrometers, as referenced in Table 1 as Example Spacer type 1. The refractive index of the silicone matrix in the material is 1.41. As shown, the adhesive bondline 441 may be approximately planar due to the spacers 450. Accordingly, the wavelength converting phosphor layer 431 may also experience minimal or no tilt due to the similarly sized spacers supporting the wavelength converting phosphor layer 431. As shown in FIG. 4B, the thickness $D_4$ of the adhesive bondline 441 on the left side is approximately the same as the thickness $D_5$ on the right side of the adhesive bondline 440. Accordingly, there is little or no tilt exhibited by the placement of the wavelength converting phosphor layer 431, as a result of the spacers 450. In the specific example, the thickness $D_4$ of the left side of the adhesive bondline 441 may be 3.79 micrometers and the thickness $D_5$ of the right side of the adhesive bondline 441 may be 4.00 micrometers thick. Notably, as shown in Table 1 herein, this deviation in thickness is well within the six standard deviation based confidence interval which ranges from 3.42 micrometers to 4.74 micrometers for this Example Spacer type 1.

Table 2 below shows experiment results for devices with their bondline thickness control:

TABLE 2

| | Spacer Size | Left (μm) | Center (μm) | Right (μm) | Observations |
|---|---|---|---|---|---|
| Control 1 | None-control | 5.1 | 7.5 | 9.4 | High Gap, large tilt ~4.3 μm |
| Control 2 | None-control | 8.1 | 8.0 | 7.5 | High Gap, low tilt |
| Control 3 | None-control | 1.8 | 4.0 | 6.2 | Medium Gap, large tilt ~4.4 μm |
| Spacer A | 4.08 um | 3.79 | 4.12 | 4.00 | Medium gap No tilt |
| Spacer B | 4.08 um | 3.87 | 4.44 | 4.66 | Medium Gap, No tilt |

As shown in Table 2, all three of the control devices (Control 1, Control 2, and Control 3) do not include the spacers disclosed herein. Control 1 exhibits a high gap and a large tilt, Control 2 exhibits a high gap and low tilt, and Control 3 exhibits a medium gap and large tilt. To contrast, both devices with spacers (Spacer A and Spacer B) exhibit a medium gap and low tilt.

According implementations disclosed herein, the size of the spacers in an adhesive bondline may be determined based on the required or desired bondline thickness size. The size of the spacers may range from a mean diameter or shortest axes of 0.5 micrometers to 10 micrometers, and preferably from 0.5 micrometers to 5 micro micrometers. It should be noted that although a range of 0.5 micrometers to 10 micrometers is provided, the spacers in a given device may be restricted by the 10% CV deviations from a mean diameter or shortest axes, as disclosed herein. Alternatively or in addition, the spacers may have a major:minor axis ratio between 1 and 1000. According to an implementation, the spacers may not have a material effect on the coefficient of thermal expansion.

According to an implementation, the size (e.g., mean diameter) of spacers in an adhesive bondline may be determined based on the permeability of gases, such as oxygen, of the adhesive bondline which may be a factor of the components of the adhesive bondline including, for example, the silicone matrix, and any other component that is included in the adhesive bondline. A greater amount of oxygen permeating through the adhesive bondline may be achieved by increasing the bondline thickness of a device. Similarly, an adhesive bondline with lower oxygen permeability may require a thicker bondline to obtain a desired amount of oxygen permeating through the adhesive bondline.

Figure 5:
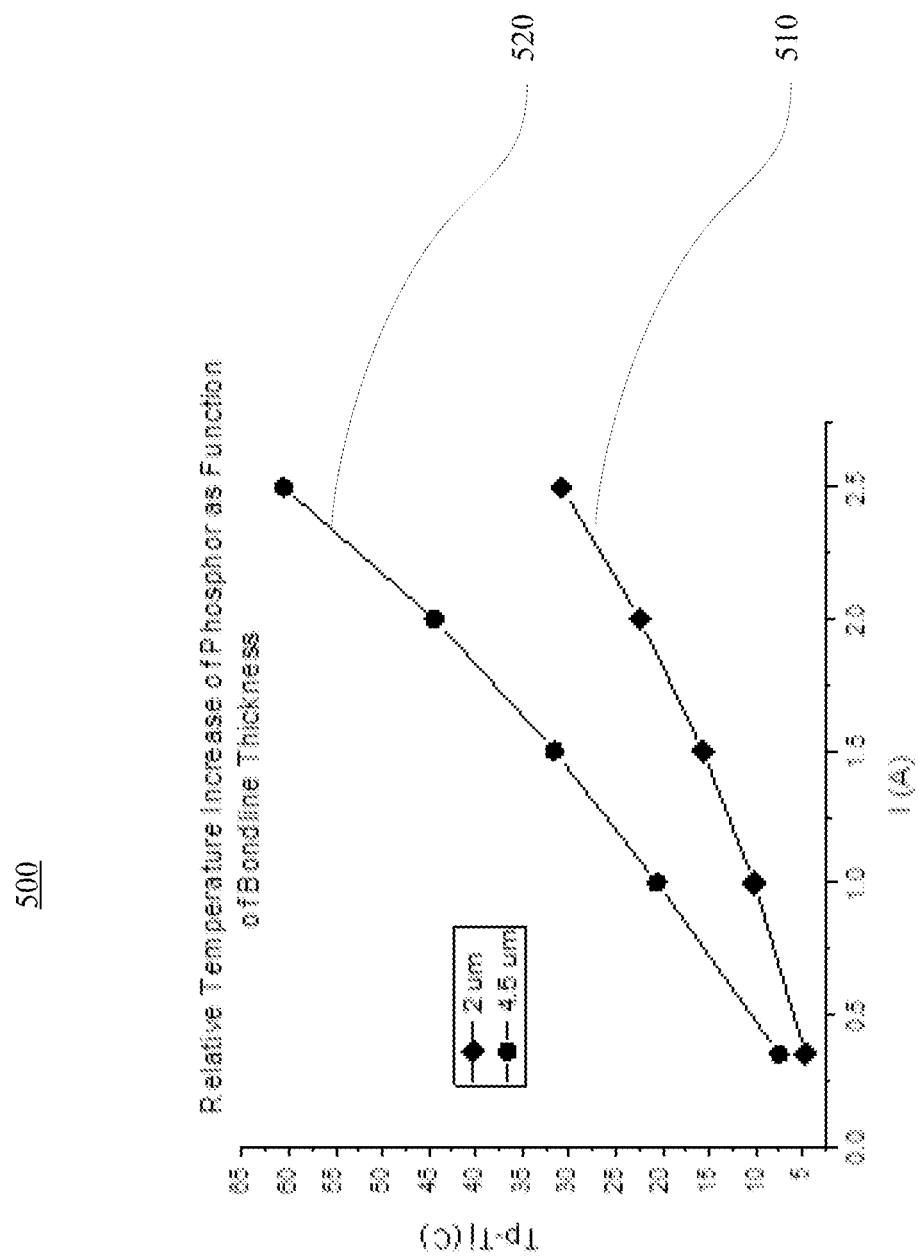
FIG. 5 is a graph representing relative temperature increases of phosphor as function of bondline thickness.

According to an implementation, the size (e.g., mean diameter) of spacers in an adhesive bondline may be determined based on thermal considerations. As shown by the graph 500 in FIG. 5, the current intensity experienced by a device with a larger bondline thickness (4.5 micrometers, represented by the curve 520) causes a greater increase in temperature of a phosphor material in comparison to a device with a smaller bondline thickness (2 micrometers, represented by curve 510). As shown, at 2.5 amps of current, the device with a smaller bondline thickness of 2 micrometers is approximately at a temperature of 30 degrees Celsius whereas at the same 2.5 amps of current, the device with a larger bondline thickness of 4.5 micrometers is approximately at a temperature of 60 degrees Celsius. Accordingly, a bondline thickness may be determined, at least in part, based on one or more temperature thresholds for a given device. Device operation may be improved with a lower temperature increase (Tp-Tj) when compared to a higher temperature increase. For example, the optimal device operation may be between 1 A/mm$^2$ to about 3 A/mm$^2$ and the Tp-Tj may limit the upper range of the driving power as Tp-Tj may increase beyond a desirable level at a higher power. As shown in the example of FIG. 5, a smaller bondline thickness (e.g., 2 micrometer gap) may generate a lower device temperature than a larger bondline thickness (e.g., 4 micrometer gap). Accordingly, for thermal considerations, a smaller spacer size (e.g., 2 micrometers) may be preferable over a larger spacer size (e.g., 4 micrometers).

According to an implementation, the size (e.g., mean diameter) of spacers in an adhesive bondline may be determined based on current density. It should be noted that the adhesive bondline may have an operating thermal conductivity in the range of 0.1 to 0.4 W/mK. The size of the spacers may be determined based, at least in part, on the current density of a given device in view of an optimal operating temperature and a photon flux. Notably, increasing current density may increase the operating temperature. As a result, a thinner bondline and, accordingly, smaller spacers may be required to improve heat management. Alternatively, increasing the current density may increase photon flux. As a result, a thicker bondline and, accordingly, larger spacers may be required to improve oxygen permeation.

The refractive index of the silicone matrix may be limited based on oxygen permeation requirements or preferences. The oxygen permeation of an adhesive bondline may decrease as a result of the resin having a molecular structure that increases its refractive index but lowers oxygen permeability at the same time. For example a silicone with 100% dimethyl side substituents (polydimethyl siloxane or PDMS) has refractive index in the range of 1.40 to 1.42, and an oxygen permeability of 780 Barrer. A siloxane with methylphenyl side chain substituents may have a refractive index RI=1.57, and oxygen permeability that is 20 to 100 times lower (e.g., 25.6 barrer) than PDMS. According to implementations disclosed herein, a silicone matrix may have a refractive index between 1.4 and 1.65. As a non-limiting example, an adhesive bondline may include a silicone matrix with a low refractive index between 1.4 and 1.44. This example adhesive bondline may include spacers that range from 1 micrometer to 5 micrometers in diameter. Notably, the lower refractive index may allow for higher oxygen permeability and, thus a thinner adhesive bondline may be acceptable. As another non-limiting example, an adhesive bondline may include a silicone matrix with a medium refractive index between 1.45 and 1.51. This example adhesive bondline may include spacers that range from 1.5 micrometers to 5 micrometers in diameter. Notably, the medium refractive index may allow for medium oxygen permeability and, thus a medium bondline thickness may be acceptable. As a non-limiting example, an adhesive bondline may include a silicone matrix with a high refractive index greater than 1.52. This example adhesive bondline may include spacers that are between 1 and 10 micrometers in diameter. Notably, the high refractive index may allow for low oxygen permeability and, thus a thicker adhesive bondline may be acceptable.

Figure 6:
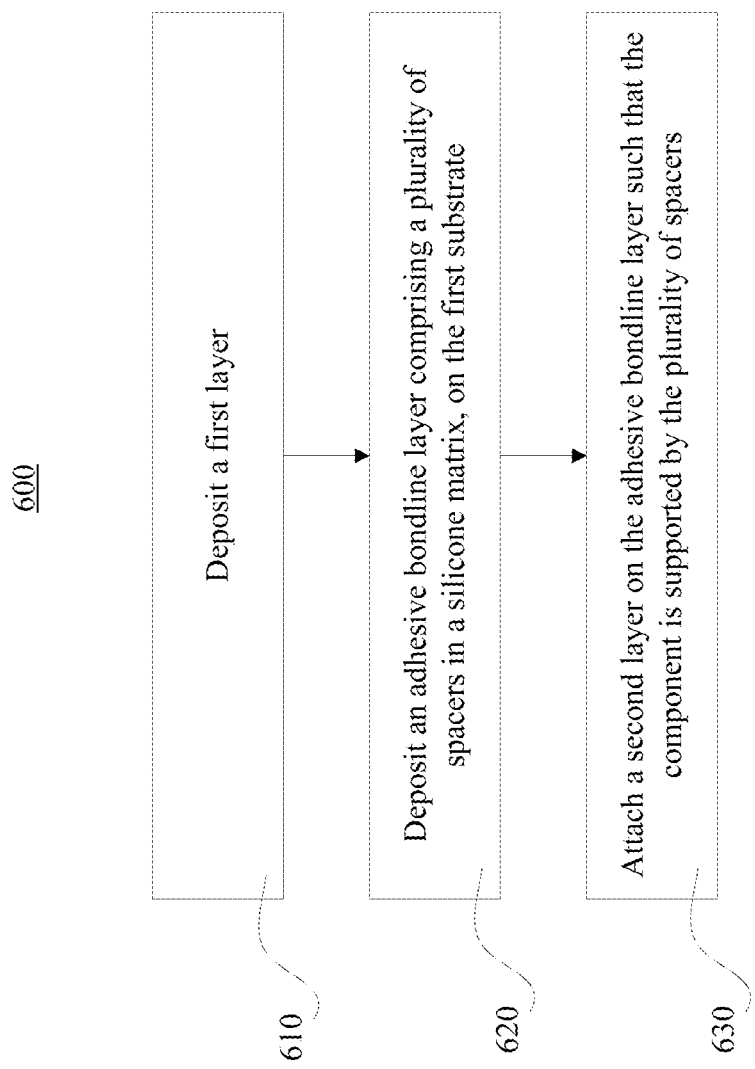
FIG. 6 is a flowchart outlining a process to deposit adhesive bondlines in accordance with the disclosed techniques.

According to an implementation, as shown in the flowchart 600 of FIG. 6, a substrate may be deposited at step 610. The substrate may be deposited via any applicable means such as a vapor deposition, a placement, a tape based deposition, a growth, or the like. At 620, an adhesive bondline layer may be deposited and may include one or more of a plurality of spacers, a silicone matrix, a diluent, or the like. The spacers may be between 0.5 and 10 micro meters in diameter or across their smallest axis. At step 630, a second layer, such as a wavelength converting layer, may be attached via the adhesive bondline layer. The second layer may be supported by the plurality of spacers which may define the thickness of the adhesive bondline.

According to an implementation, the spacers in an adhesive bondline may be a part of one or both of the layers that are to be attached to each other via the bondline adhesive bondline. For example, a number of spacers may be defined using photolithography, imprint lithography, jet printing, aerosol jet printing, or other patterning technique to pattern the spacers directly onto a layer. Adhesive material may be deposited before or after attaching a first layer to a second layer such that it flows between the spacers that are part of one or both of the layers that are to be attached to each other. According to an implementation, a combination of spacers that are part of one or both layers that are to be attached and additional spacers that are part of the adhesive bondline may be used.

The figures provided herein are provided as an example only. At least some of the elements discussed with respect to these figures can be arranged in different order, combined, and/or altogether omitted. It will be understood that the provision of the examples described herein, as well as clauses phrased as "such as," "e.g.", "including", "in some aspects," "in some implementations," and the like should not be interpreted as limiting the disclosed subject matter to the specific examples.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A device comprising:
    a light emitting diode;
    a wavelength converting phosphor layer; and
    an adhesive layer bonding the light emitting diode to the wavelength converting phosphor layer, the adhesive layer comprising:
        a plurality of spacers dispersed in
        a silicone matrix, the diameters of the spacers determining a thickness of the adhesive layer;
    wherein the plurality of spacers have a size distribution with a mean diameter of between 1 and 5 microns and a coefficient of variation of less than 5%.

2. The device of claim 1, wherein the plurality of spacers comprise at least one of silica, alumina, inorganic glass, or polymer.

3. The device of claim 1, wherein the silicone matrix comprises a refractive index of between 1.4 and 1.65.

4. The device of claim 1, wherein the spacers are configured to enable increased oxygen permeation into the adhesive layer bondline.

5. The device of claim 1, wherein the mean diameter for the plurality of spacers is determined based on one or more of a browning amount, device geometry, an environmental gas permeability amount, a temperature threshold, a refractive index (RI), or a desired light extraction efficiency.

6. The device of claim 1, wherein the silicone matrix comprises a refractive index of between 1.4 and 1.44.

7. The device of claim 1, wherein the silicone matrix comprises a refractive index of between 1.45 and 1.51.

8. The device of claim 1, wherein the silicone matrix comprises a refractive index of greater than 1.51.

9. The device of claim 1, wherein the plurality of spacers are substantially spherical.

10. The device of claim 1, wherein the plurality of spacers comprise spacers that are not substantially spherical and are configured to orient such that their shortest axes is in a direction perpendicular to a plane of the light emitting diode and wherein the particle diameter is measured across the shortest axis.

11. The device of claim 10, wherein the plurality of spacers comprise a major:minor axis with a ratio between 1 and 1000.

12. The device of claim 1, wherein a temperature of the adhesive layer is maintained below a temperature threshold while a maximum current is applied to the light emitting diode.

13. The device of claim 1, wherein the adhesive layer comprises between approximately 100 to 5000 spacers per $mm^2$.

14. The device of claim 1, wherein the difference in height between a first end of the wavelength converting phosphor layer and a second end of the wavelength converting phosphor layer is less than 1 micro meters.

15. A method comprising:
    depositing an adhesive layer onto a light emitting diode, the adhesive layer comprising:
        a plurality of spacers dispersed in
        a silicone matrix, the diameters of the spacers determining a thickness of the adhesive layer; the plurality of spacers have a size distribution with a mean diameter of between 1 and 5 microns and a coefficient of variation of less than 5%; and
    depositing a wavelength converting phosphor layer over the adhesive layer.

* * * * *